US007864829B2

(12) United States Patent
Asahi et al.

(10) Patent No.: US 7,864,829 B2

(45) Date of Patent: Jan. 4, 2011

(54) DROPPING MODEL ELECTROSTATIC LEVITATION FURNACE

(75) Inventors: Hiroaki Asahi, Hamura (JP); Hidehiko Tamaoki, Tokyo (JP)

(73) Assignees: Air Trick Inc., Tokyo (JP); IHI Aerospace Co., Ltd, Tokyo (JP)

( * ) Notice: Subject to any disclaimer, the term of this patent is extended or adjusted under 35 U.S.C. 154(b) by 917 days.

(21) Appl. No.: 11/547,513

(22) PCT Filed: Mar. 31, 2004

(86) PCT No.: PCT/JP2004/004754

§ 371 (c)(1), (2), (4) Date: Oct. 2, 2006

(87) PCT Pub. No.: WO2005/100893

PCT Pub. Date: Oct. 27, 2005

(65) Prior Publication Data

US 2007/0274368 A1 Nov. 29, 2007

(51) Int. Cl.
*F27D 7/06* (2006.01)
*H01J 37/305* (2006.01)
*H01H 47/00* (2006.01)

(52) U.S. Cl. .......................... 373/111; 373/10; 361/144

(58) Field of Classification Search ..................... 373/2, 373/20, 111; 219/121.36, 648, 672, 121.6, 219/121.63, 121.64, 121.65, 121.66; 361/234; 257/461, 465

See application file for complete search history.

(56) References Cited

U.S. PATENT DOCUMENTS

| | | | | |
|---|---|---|---|---|
| 4,521,854 | A * | 6/1985 | Rhim et al. | 700/90 |
| 4,553,917 | A * | 11/1985 | Lee | 425/6 |
| 5,319,670 | A * | 6/1994 | Fox | 373/138 |
| 6,153,007 | A * | 11/2000 | Nakata | 117/11 |
| 6,294,822 | B1 * | 9/2001 | Nakata | 257/461 |
| 7,061,964 | B2 * | 6/2006 | Kawasaki et al. | 373/2 |
| 7,447,250 | B2 * | 11/2008 | Kawasaki et al. | 373/2 |
| 2005/0024808 | A1 * | 2/2005 | Kawasaki et al. | 361/234 |
| 2005/0199180 | A1 * | 9/2005 | Yono et al. | 117/2 |

FOREIGN PATENT DOCUMENTS

| | | | |
|---|---|---|---|
| JP | 4-091000 | A | 3/1992 |
| JP | 11-241888 | A | 9/1999 |
| JP | 2002-192332 | A | 7/2002 |
| JP | 2003-139469 | A | 5/2006 |

* cited by examiner

*Primary Examiner*—Tu B Hoang
*Assistant Examiner*—Hung Nguyen
(74) *Attorney, Agent, or Firm*—Sughrue Mion, PLLC

(57) ABSTRACT

A dropping model electrostatic levitation furnace which puts a charged sample in levitation state by an electric field generated between electrodes and subjects the sample to heat treatment, in which a drop tube evacuatable in vacuum is connected vertically at the lower side of a furnace body to allow the sample to drop through the drop tube with a beam irradiating optical system having a heating laser beam. This brings experimental results which the influence of an electric field and gravity is eliminated sufficiently by means of a furnace having comparatively simple constitution, and also enables to reduce the cost drastically with high experimental environment.

16 Claims, 1 Drawing Sheet

DROPPING MODEL ELECTROSTATIC LEVITATION FURNACE

This is a National Stage entry of International Application PCT/JP2004/004754, with an international filing date of Mar. 31, 2004, which was published as WO 2005/100893 A1, and the complete disclosure of which is incorporated into this application by reference.

TECHNICAL FIELD

The present invention relates to a dropping model electrostatic levitation furnace which is used for putting a charged sample into levitation state by an electric field generated between electrodes and subjecting the sample to heat treatment.

BACKGROUND ART

Generally, an electrostatic levitation furnace comprises, in an enclosed space evacuatable in a vacuum, a pair of electrodes and an optical system irradiating a sample levitated between electrodes with a laser beam which is condensed at the outside of the enclosed space and led into the inside thereof, and the furnace makes a vacuum in an enclosed space, levitates a charged sample by an electric field generated between electrodes, and irradiates the sample with a laser beam to subject to heat treatment without contact.

In order to effectuate the better heat treatment of a sample, it is preferable that this kind of electrostatic levitation furnace is used under weightless environment including microgravity conditions. As the ways of generating weightless environment are that of mounting an electrostatic levitation furnace on a space craft or an aircraft and that of using a drop tower which subjects the furnace to free fall.

However, when employing an aircraft, which is one of the ways of generating weightless environment for an electrostatic levitation furnace, the gravity level of the furnace is the order of $10^{-2}$G, which is not necessarily adequate for the weightless environment thereof. When employing a space craft or a drop tower, the gravity level of the furnace is the order of $10^{-3}$G, which is adequate for the weightless environment thereof than using the aircraft, but then, such cases have some problems that the apparatus becomes large scale and requires enormous amounts of cost and to conduct a multitude of experiments with changing parameters has difficulty.

DISCLOSURE OF THE INVENTION

The present invention was carried out in consideration of conventional ways mentioned above. The object of the invention is to provide a dropping model electrostatic levitation furnace which has comparatively simple constitution and generates sufficient weightless environment on the ground in parallel with producing the significant reduction of the cost.

One aspect of a dropping model electrostatic levitation furnace of the invention is an electrostatic levitation furnace which puts a charged sample into levitation state by an electric field and subjects the sample to heat treatment, and the furnace is provided with a drop tube evacuatable in a vacuum which is connected vertically to the lower side of a furnace body to allow the inside of the furnace body to communicate with the inside of the drop tube and also to allow the sample to drop through the drop tube.

Besides, in another aspect of a dropping model electrostatic levitation furnace of the invention, a laser beam which is led from the upper side of a furnace body is employed as a heating source for a sample, a lower electrode is provided with a beam irradiation optical system which irradiates on the sample with the laser beam led therefrom, the lower electrode is arranged in position allowing for dropping through a drop tube, and an electrode holder which releases the lower electrode at the same time breaking energization for the lower electrode is provided.

Further, in another aspect of a dropping model electrostatic levitation furnace of the invention, a lower electrode is provided with an opening which is arranged at lower side thereof and allows a sample to pass through, and an electrode catcher which catches the lower electrode and a sample catcher which catches the sample at more lower position than the electrode catcher are provided at the lower end of the drop tube.

Furthermore, in another aspect of a dropping model electrostatic levitation furnace of the invention, a drop tube is provided with a gate valve which divides the interior space of the drop tube between upper and lower spaces and vacuum pumps are provided in each of the upper space and the lower space.

BRIEF DESCRIPTION OF THE DRAWINGS

FIG. 1A is a cross section diagram of the furnace showing an initial state of heat treatment, FIG. 1B is a cross section diagram of the furnace showing a state which a sample and a lower electrode are on dropping, and FIG. 1C is a cross section diagram of the furnace showing a state which a sample and a lower electrode have dropped.

BEST MODE FOR CARRYING OUT THE INVENTION

Figure 1C:
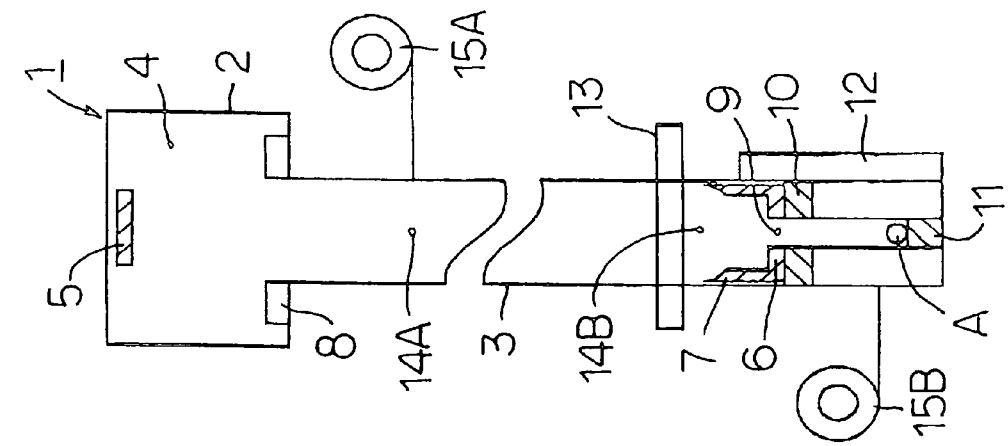
FIGS. 1A, 1B and 1C are schematic diagrams illustrating one embodiment of a dropping model electrostatic levitation furnace of the invention.
Figure 1B:
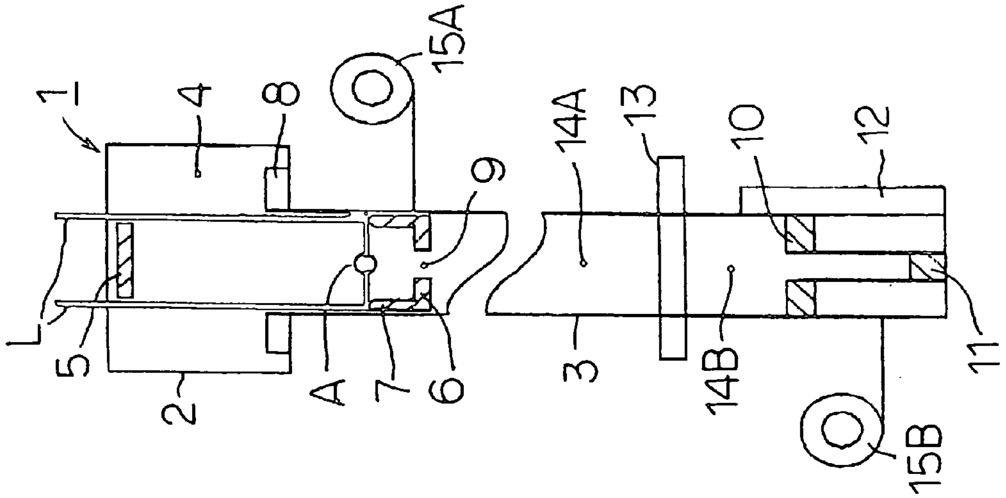
Figure 1A:
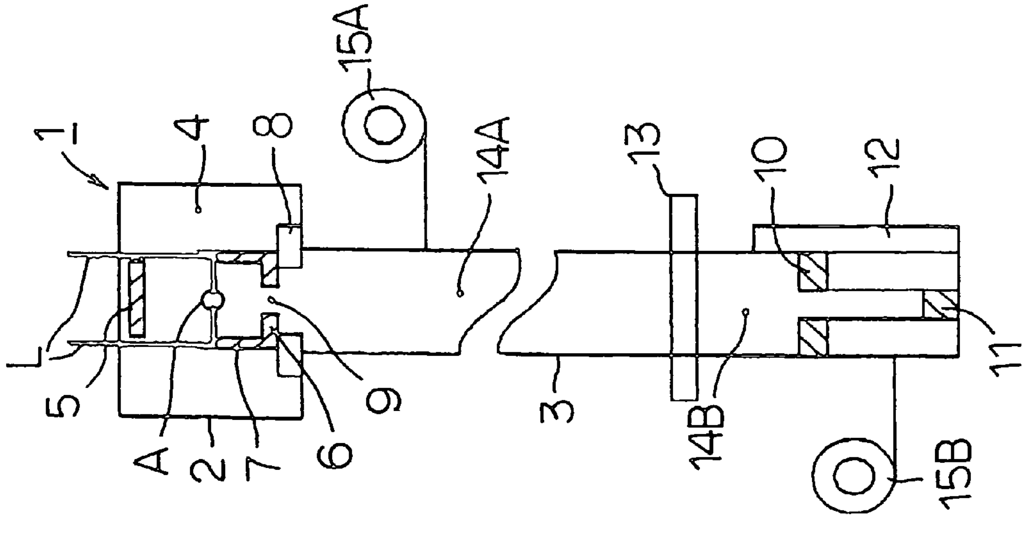

FIGS. 1A, 1B, and 1C are diagrams showing one embodiment of a dropping model electrostatic levitation furnace of the invention. In a dropping model electrostatic levitation furnace 1 shown in FIG. 1A, a drop tube 3 evacuatable in a vacuum is vertically connected to the lower side of a furnace body 2 to allow the inside of the furnace body 2 to communicate with the inside of the drop tube 3 and also to allow a sample A to drop through the inside of the drop tube 3 with noncontact.

The furnace body 2 forms an enclosed space 4 except for a connected portion of the drop tube 3, the enclosed space 4 is provided with an upper electrode 5 and a lower electrode 6 facing vertically, and, hereinafter not shown in the figures, the furnace is provided with two or more access ports and may be installed various types of devices such as a supply device, a position detector, and a temperature measurement device for the sample A, and a camera and a lighting which image of the sample A.

The electrostatic levitation furnace 1 is provided with a laser oscillator out of the figure. More than one laser beam L which is vertically led from the upper side of the furnace body 2 is employed as a heating source for the sample A. The lower electrode 6 is integrally provided with a beam irradiation optical system 7 which condenses and irradiates on the sample A in the center of the furnace body with more than one laser beam which is led from the upper side of the furnace body, is arranged so as to be droppable through the drop tube 3 together with the sample A with noncontact, and is held by an electrode holder 8. The lower electrode 6 has at the center thereof an opening 9 which allows the sample A to pass through.

The beam irradiation optical system 7 comprises a concave converging reflecting mirror, or a combination of a reflecting mirror and a converging lens, and reflects horizontally more than one laser beam which is led from the upper side of the furnace body 2 and converges on the sample A intensively to heat the sample A evenly. The electrode holder 8 holds, in the furnace body 2, the lower electrode 6 just above the drop tube 3, and has the function of breaking energization for the lower electrode 6 while releasing the lower electrode 6.

The drop tube 3 can adjust to the appropriate length to ensure the weightless environment for the sample A within a predetermined time by dropping it, and is provided with, at the lower part thereof, an annular electrode catcher 10 which catches the dropped lower electrode 6, a sample catcher 11 which catches the dropped sample A at the more lower position than the electrode catcher 10, and an airtight door 12 from which the sample A and the lower electrode 6 dropped are retrieved to the outside.

For example, a shock absorbing sheet may be applied to the electrode catcher 10 and the sample catcher 11 in order to cushion the dropping shock of the lower electrode 6 and the sample A. As described later, in cases where the sample A is subjected to turning to amorphous, the sample catcher is formed from rigid material such as metal in order that the sample A is collided against the sample catcher 11 to quench and solidify the sample A rapidly.

The drop tube 3 is provided with, near the lower end thereof, a gate valve 13 which divides the interior space of the drop tube into each upper and lower spaces with hermeticity. Each upper space 14A and lower space 14B is provided with, at each interior space thereof, a vacuum pump 15A and 15B. The electrode catcher 10 and the sample catcher 11 mentioned above are provided in the lower space 14B. Although not shown in figures, each of the space 14A and 14B is provided with a vacuum indicator.

A dropping model electrostatic levitation furnace 1 which is provided with components mentioned above basically has a comparatively simple equipment constitution in which a drop tube is connected at the lower side of a furnace body, and has scarcely any limitation for installation location thereof to allow to install in various establishments such as enterprises, laboratories, and school. Further, the furnace enables to reduce the cost drastically as against a case which is performed by means of a space craft, an aircraft, or a drop tower and to bring sufficient weightless environment described below.

Specifically, a dropping model electrostatic levitation furnace 1 actuates at least one of vacuum pumps 15A and 15B to evacuate the inside of a furnace body 2 and a drop tube 3 into a vacuum, for example approximately $10^{-4}$ Torr. As a matter of course, when both of two vacuum pumps 15A and 15B are put in operation, the vacuum can be formed in more short time. Thereafter, in the electrostatic levitation furnace 1, the sample A is charged. And then the charged sample A is put into levitation state by an electric field generated between an upper electrode 5 and a lower electrode 6 and is subjected to heat treatment by means of more than one laser beam L.

Right after the sample A has been melted by heating, when the holding for the lower electrode 6 by an electrode holder 8 is released, the lower electrode 6 drops without having contact with the inside wall of the drop tube 3. Since the electrode holder 8 breaks energization for the lower electrode 6 concurrently with the release of the electrode, the electric field is evanescent and the sample A is dropped into the drop tube 3. At this time, the inside of the drop tube is vacuum and thus the lower electrode 6 and the sample A are dropped at same speed with keeping the positional relation each other. By subjecting the sample A to falling freely in such a way, a sufficient weightless environment in which the level of gravity is approximately $10^{-3}$G or more lower level can be provided.

Besides, since the electrostatic levitation furnace 1 has the structure where more than one laser beam L is led from the upper side of the furnace body 2 and is provided with a beam irradiation optical system 7 which is integrally carried on the lower electrode 6, as shown in FIG. 1B, while the lower electrode 6 and the sample A are dropping, more than one laser beam L continues irradiating on the sample A concentratively. That is to say, the sample A is subjected to uniform heating with no influence of an electric field, in a vacuum atmosphere, under a weightless environment by dropping, and with noncontact.

As an electrostatic levitation furnace of conventional art constantly forms an electric field in order to control the position of a levitated sample, the melted sample, even if under weightless environment, is deformed toward the electric field. Therefore, it is difficult to avoid the influence of an electric field when a sample is melted and solidified. Contrarily, an electric levitation furnace 1 can eliminate the influence of an electric field completely and can keep the sample A in a melted state until the sample is completely free from the influence of the electric field and gravity, so that the furnace can satisfactorily perform melting and solidifying of the sample A.

Thereafter, in the electrostatic levitation furnace 1, as shown in FIG. 1C, the transmission of a laser beam L is stopped right before a lower electrode 6 is caught by an electrode catcher 10, and subsequently, the sample A which passes through the opening 9 of the lower electrode 6 is caught by a sample catcher 11. Thus, the sample A is continued to heat right before the sample reaches to the sample catcher 11 and is hurled against the sample catcher 11 with gravity to be thinly squashed, and then the sample A is quenched and solidified rapidly to be turned to amorphous. At this time, as the lower electrode is separated from the sample A by the electrode catcher 10 arranged upper than the sample catcher 11 and the sample catcher 11 arranged lower, the melted sample A does not adhere to the lower electrode 6. The sample A shown in FIG. 1C does not represent deformed one, but one solidified spherically.

After heat treatment as mentioned above, a gate valve 13 is closed to divide airtightly between an upper space 14A and a lower space 14B, the lower space 14B is opened to outside air, and the sample A and the lower electrode 6 is retrieved from an airtight door 12. The interior space of the furnace body 2 and the upper space 14A are maintained in vacuum conditions by application of the gate valve 13 in such a way. Therefore, as the operation which is needed before another experiment is only that of evacuating the lower space 14B in vacuum by a vacuum pump 15B and subsequently opening the gate valve 13, it is possible to prepare the experiment in short time.

As described above, the electrostatic levitation furnace 1 can be used above ground, has comparatively simple equipment constitution, and can perform heat treatment on the sample A, with never exerting the influence of an electric field thereon, under sufficiently weightless environment equivalent to one generated at the very least by means of a space craft or a drop tower, and with noncontact. Further, the furnace can easily control to carry out a good many experiments with changing parameters. Besides, when using the drop tower in the conventional way, the electrostatic levitation furnace itself is subjected to dropping off, and then an apparatus therefor becomes large-scale. However, as the electrostatic levitation furnace 1 subjects the sample A and the lower electrode 6 only to dropping off, the furnace has an incredibly simple structure among dropping model furnaces.

In addition, a dropping model electrostatic levitation furnace of the invention has constitution which is not limited to above embodiments, and allows to change the details of the constitution accordingly within the scope of the outline of the present invention. The abovementioned embodiments of the invention is illustrated an instance where the sample A is continuously heated while being subjected to dropping, and finally is formed in amorphous. Additionally, a method in which the sample A is melted with heating in the furnace body 2 and subsequently, just like the case of forming amorphous, is dropped with the lower electrode 6, is kept in a melted state until getting free of the influence of an electric field and gravity, and then is solidified may be employed. And furthermore, as a simple method, a method of subjecting the sample A to dropping by breaking energization for the electrodes 5 and 6 to vanish an electric field may be also employed. In such a way, it is possible that the sample A is subjected to solidifying without the influence of an electric field and under sufficiently weightless environment. In this case, in order to prevent the fracture of the solidified sample A, it is preferable that the sample catcher 11 is attached a cushioning such as a shock absorbing sheet.

INDUSTRIAL APPLICABILITY

A dropping model electrostatic levitation furnace of the invention has comparatively simple constitution in which a drop tube is connected under a furnace body and supplies sufficiently weightless environment, that is a gravity level of approximately $10^{-3}$ G, for a sample by dropping the sample which is heated within the furnace body through a drop tube. For example, when a sample which is heated and melted is subjected to solidifying, the furnace accomplishes to perform the good solidification of a sample under sufficiently weightless environment and without the influence of an electric field. Further, the furnace enables to reduce the cost drastically as against a case which is performed by means of a space craft, an aircraft, or a drop tower, and furthermore, the furnace can easily control to carry out a good many experiments with changing parameters.

Besides, a preferred embodiment of a dropping model electrostatic levitation furnace of the invention subjects a lower electrode which is provided with a beam irradiation optical system to dropping with a sample to enable to continuously heat a sample in dropping with a laser beam. That is, the furnace keeps a sample in a melted state under weightless environment by dropping, and, at this occasion, breaks energization for a lower electrode, and accordingly the furnace can perform heating and solidifying a sample without even the influence of an electric field.

Further, in a preferred embodiment of a dropping model electrostatic levitation furnace of the invention, a sample catcher is formed with rigid such as metal, and a sample is heated by irradiating with a laser beam right before a sample is reached to the sample catcher and is hurled against the sample catcher with gravity, with the result that the sample is quenched and solidified rapidly to be formed in amorphous. As the lower electrode is separated from the sample by the electrode catcher arranged upper than the sample catcher and the sample catcher arranged lower, a fear which the melted sample adheres to the lower electrode is also avoided.

Furthermore, a preferred embodiment of a dropping model electrostatic levitation furnace of the invention subjects an interior portion of a furnace body and a drop tube to forming a vacuum at short times by means of two vacuum pumps. In particularly, when a sample and a lower electrode which are dropped into the drop tube are retrieved to the outside, a gate valve is closed to release only an lower space to outside air and the interior portion of the furnace body and an upper space are kept in vacuum state. Therefore, as the operation which is needed before another experiment is only that of evacuating the lower space in vacuum and subsequently opening the gate valve, it is possible to prepare the experiment in short times.

What is claimed is:

1. A dropping model electrostatic levitation furnace which puts a charged sample into levitation state by an electric field generated between electrodes and subjects the sample which is levitated to heat treatment, wherein a drop tube evacuatable in vacuum is vertically connected at the lower side of a furnace body to allow the inside of the furnace body to communicate with the inside of the drop tube and to allow the sample to drop through the drop tube, and wherein a laser beam which is led from the upper side of the furnace body is employed as a heating source for a sample, a lower electrode is provided with a beam irradiation optical system which irradiates on the sample with the laser beam led therefrom and is arranged in position allowing for dropping through the drop tube, and an electrode holder which releases the lower electrode at the same time breaking energization for the lower electrode is provided.

2. The dropping model electrostatic levitation furnace of claim 1, wherein the lower electrode is provided with an opening which is arranged at lower side thereof and allows a sample to pass through, and an electrode catcher which catches the lower electrode and a sample catcher which catches the sample at more lower position than the electrode catcher are provided at the lower end of the drop tube.

3. The dropping model electrostatic levitation furnace of claim 1, wherein the drop tube is provided with a gate valve which divides the interior space of the drop tube into upper and lower spaces, and vacuum pumps are provided in each of the upper space and the lower space.

4. The furnace of claim 1, wherein the sample is not exposed to the electric field when in the drop tube.

5. A dropping model electrostatic levitation furnace that heats a sample without deformation from an electric field, said dropping model electrostatic levitation furnace comprising:

electrodes that generate an electric field thereby levitating a sample, a heating source which heats the sample, and a drop tube vertically attached at a lower side of a furnace body thereby connecting an inside of the drop tube to an inside of the furnace body;

wherein the inside of the drop tube is under vacuum, wherein the sample drops from the inside the furnace body through the inside of the drop tube, wherein the sample is heated while dropping through the drop tube to maintain said sample in a molten state; and wherein said electrodes comprise a lower electrode arranged in such a position that the lower electrode can be dropped through the drop tube.

6. The furnace of claim 5, wherein the sample is not exposed to the electric field when in the drop tube.

7. The furnace of claim 5, wherein the sample is heated while being levitated.

8. The furnace of claim 5, wherein at least one laser beam is employed as the heating source.

9. The furnace of claim 5, wherein said lower electrode is provided with a beam irradiation optical system that heats the sample with the heating source led therefrom.

10. The furnace of claim 5, further comprising an electrode holder which releases a lower electrode of the electrodes at an approximate time when a break energization of the lower electrode is provided.

11. The furnace of claim 5, further comprising an electrode catcher which catches a lower electrode of the electrodes and is arranged at a lower end of the drop tube.

12. The furnace of claim 5, further comprising a sample catcher which catches the sample and is arranged at a lower end of the drop tube.

13. The furnace of claim 5, further comprising a sample catcher and an electrode catcher both arranged at a lower end of the drop tube wherein the sample catcher is arranged at a position lower than that of the electrode catcher.

14. The furnace of claim 5, further comprising a sample catcher and an electrode catcher that contain respective cushionings that act as a shock absorber wherein the sample catcher is formed from a rigid material.

15. The furnace of claim 5, wherein the drop tube contains a gate valve which divides an interior space of the drop tube into an upper and lower space, and wherein vacuum pumps are provided in each of the upper and lower spaces.

16. A dropping model electrostatic levitation furnace that heats a sample without deformation from an electic field, said dropping model electrostatic levitation furnace comprising:

electrodes that generate an electric field thereby levitating a sample, said electrodes comprising a lower electrode provided with an opening that allows the sample to pass through, the lower electrode being arranged at the lower side of the furnace body, a heating source which heats the sample, and a drop tube vertically attached at a lower side of a furnace body thereby connecting an inside of the drop tube to an inside of the furnace body;

wherein the inside of the drop tube is under vacuum, wherein the sample drops from the inside the furnace body through the inside of the drop tube, and wherein the sample is heated while dropping through the drop tube to maintain said sample in a molten state.

* * * * *